(12) United States Patent
Poeppel et al.

(10) Patent No.: US 8,169,070 B2
(45) Date of Patent: May 1, 2012

(54) SEMICONDUCTOR DEVICE

(75) Inventors: Gerhard Josef Poeppel, Regensburg (DE); Irmgard Escher-Poeppel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 12/466,741

(22) Filed: May 15, 2009

(65) Prior Publication Data

US 2010/0289095 A1 Nov. 18, 2010

(51) Int. Cl.
*H01L 23/52* (2006.01)

(52) U.S. Cl. . 257/692; 257/693; 257/698; 257/E23.019; 438/108; 438/126

(58) Field of Classification Search .................. 257/692, 257/693, 698, E23.019; 438/108, 126
See application file for complete search history.

(56) References Cited

U.S. PATENT DOCUMENTS

| | | | |
|---|---|---|---|
| 7,048,450 B2 | 5/2006 | Beer et al. | |
| 7,096,716 B2 | 8/2006 | Theil | |
| 2005/0017370 A1* | 1/2005 | Stasiak | 257/777 |
| 2005/0218488 A1* | 10/2005 | Matsuo | 257/678 |
| 2006/0000259 A1 | 1/2006 | Rothschild et al. | |
| 2006/0171698 A1 | 8/2006 | Ryu et al. | |
| 2007/0026567 A1 | 2/2007 | Beer et al. | |
| 2007/0134835 A1* | 6/2007 | Fukuda et al. | 438/48 |
| 2007/0158772 A1* | 7/2007 | Boettiger | 257/432 |
| 2008/0105966 A1 | 5/2008 | Beer et al. | |
| 2008/0316714 A1* | 12/2008 | Eichelberger et al. | 361/728 |
| 2009/0008762 A1* | 1/2009 | Jung | 257/686 |
| 2009/0008793 A1 | 1/2009 | Pohl et al. | |
| 2009/0066345 A1 | 3/2009 | Klauk et al. | |
| 2009/0243045 A1* | 10/2009 | Pagaila et al. | 257/621 |
| 2010/0117530 A1* | 5/2010 | Lin et al. | 313/512 |
| 2010/0140779 A1* | 6/2010 | Lin et al. | 257/690 |

FOREIGN PATENT DOCUMENTS

DE 10 2005 043 557 9/2006

OTHER PUBLICATIONS

"Embedded Wafer Level Ball Grid Array", M. Brunnbauer, et al., IEEE 2006 (5 pgs.).

* cited by examiner

*Primary Examiner* — Tu-Tu Ho
(74) *Attorney, Agent, or Firm* — Dicke, Billig & Czaja, PLLC

(57) ABSTRACT

The semiconductor device comprises a semiconductor chip defining a first face and a second face opposite to the first face, the semiconductor chip comprising at least one contact element on the first face of the semiconductor chip, an encapsulating body encapsulating the semiconductor chip, the encapsulating body having a first face and a second face opposite to the first face, a redistribution layer extending over the semiconductor chip and the first face of the encapsulating body and containing a metallization layer comprising contact areas connected with the contact elements of the semiconductor chip, and an array of external contact elements located on the second phase of the encapsulating body.

18 Claims, 7 Drawing Sheets

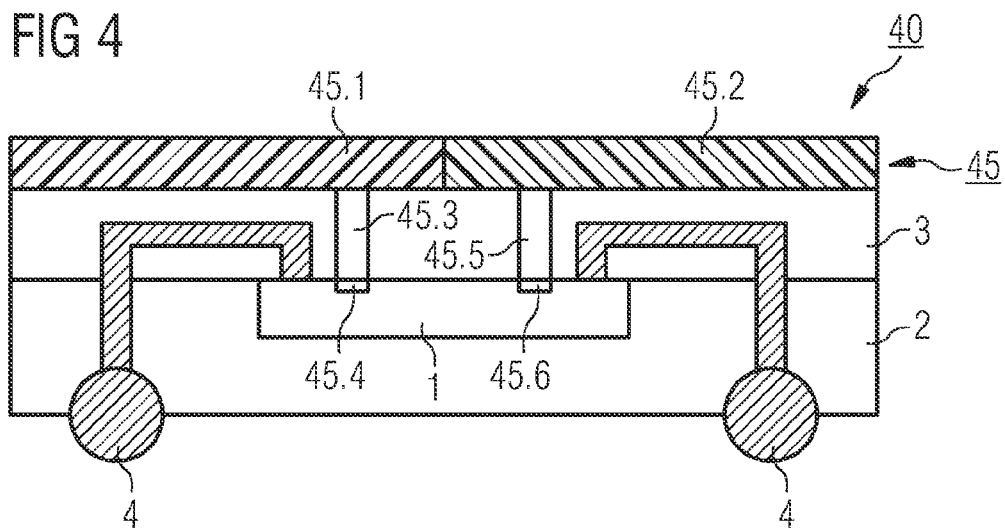
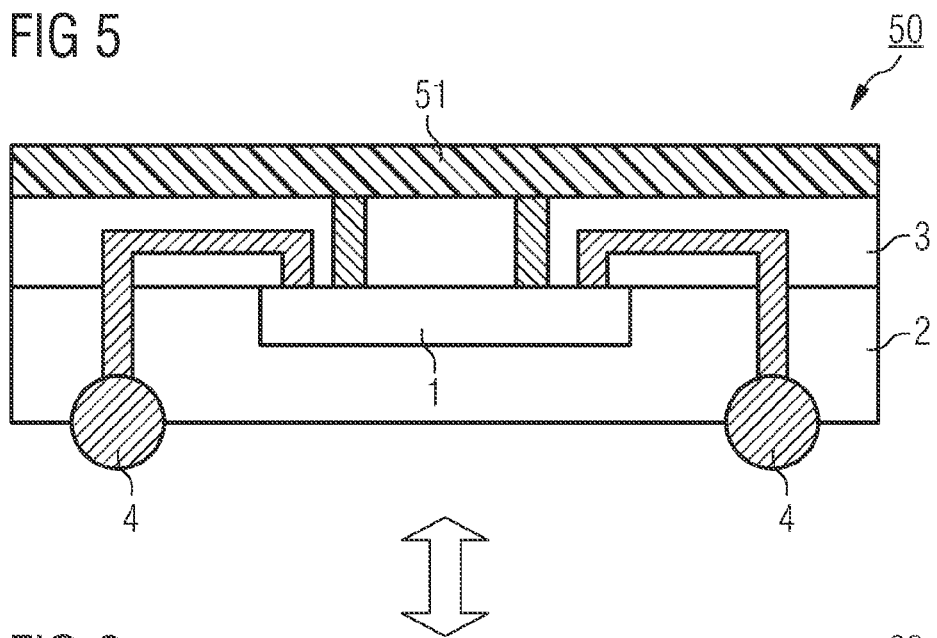
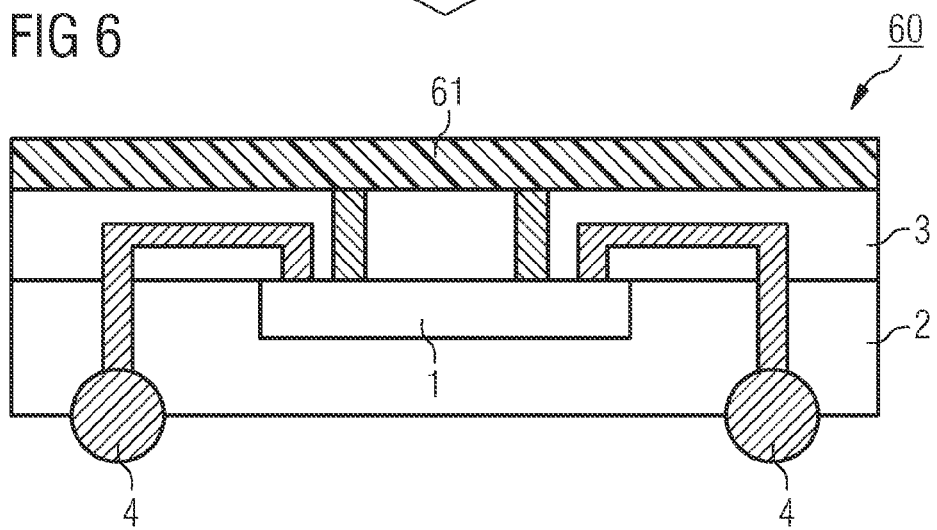

FIG 7
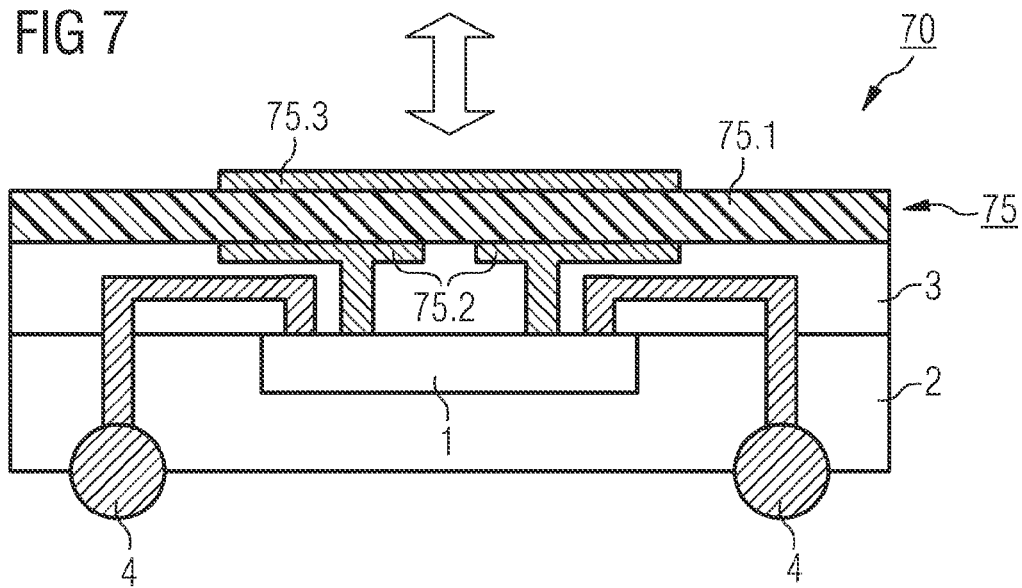
FIG 8
A)
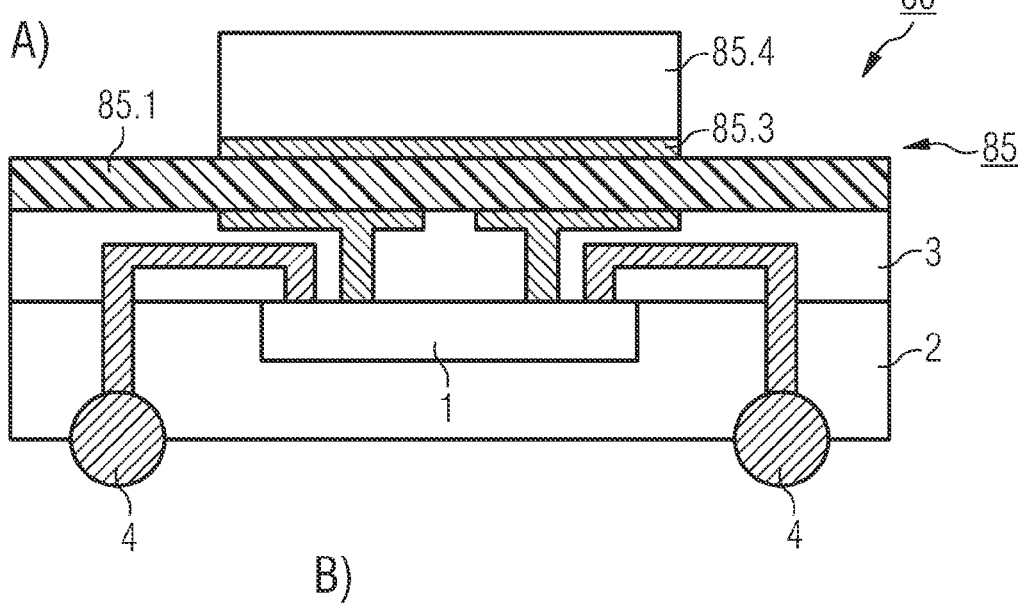
B)
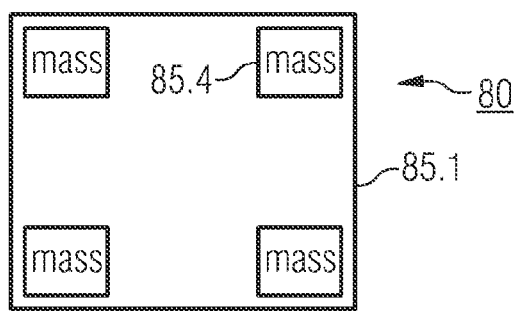

FIG 9
A)
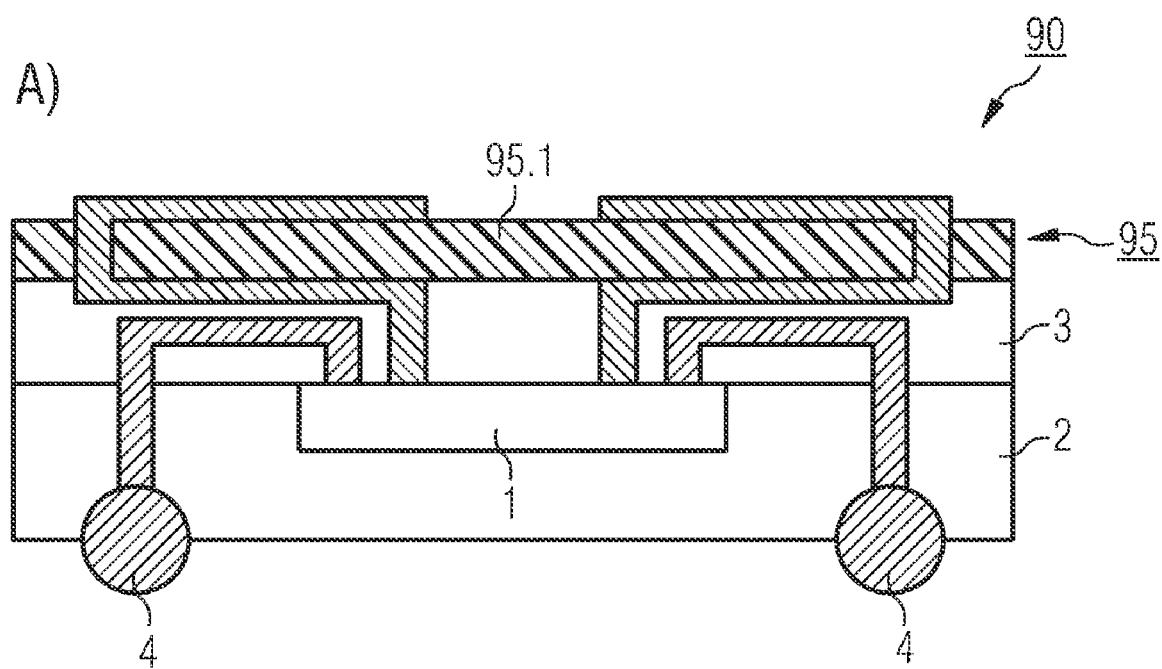
B)
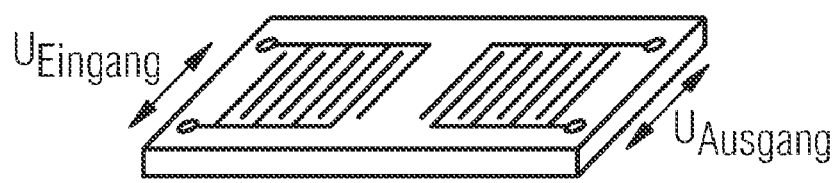

FIG 12
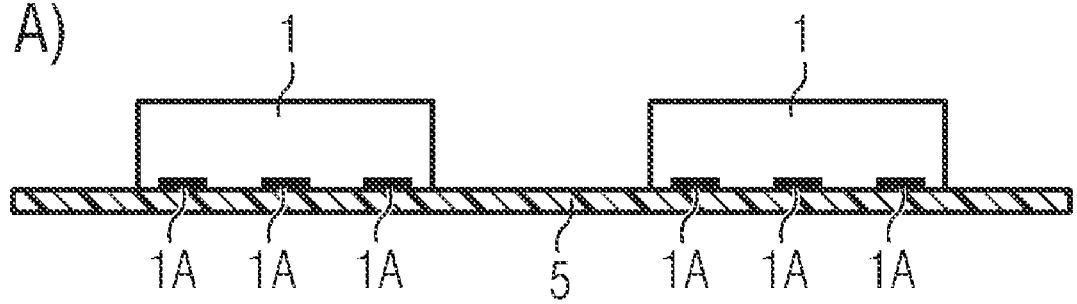
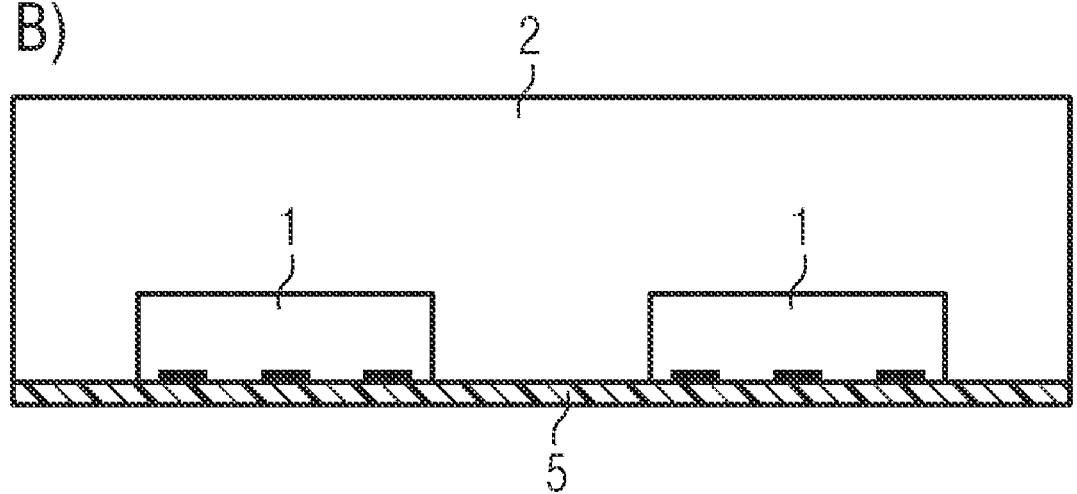
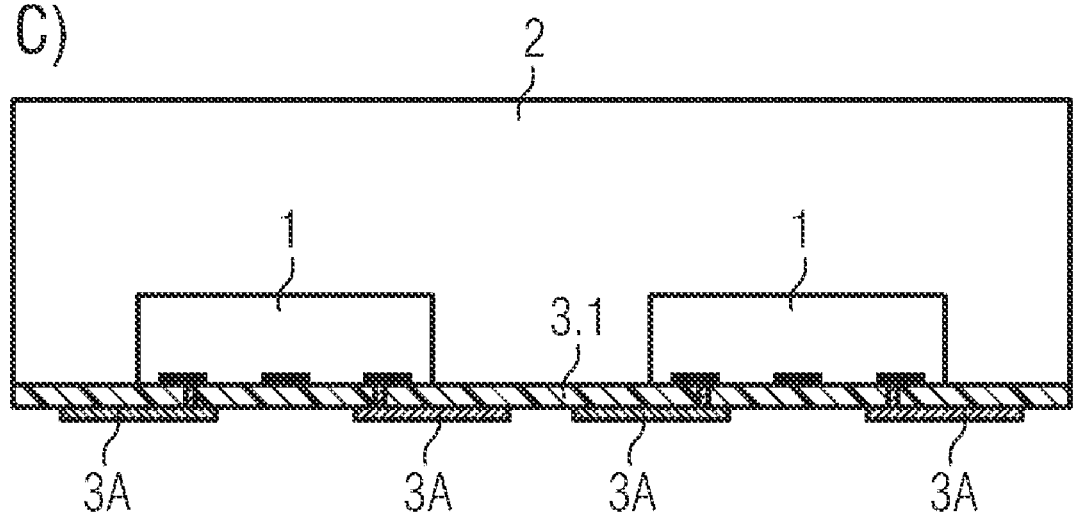

FIG 12
D)
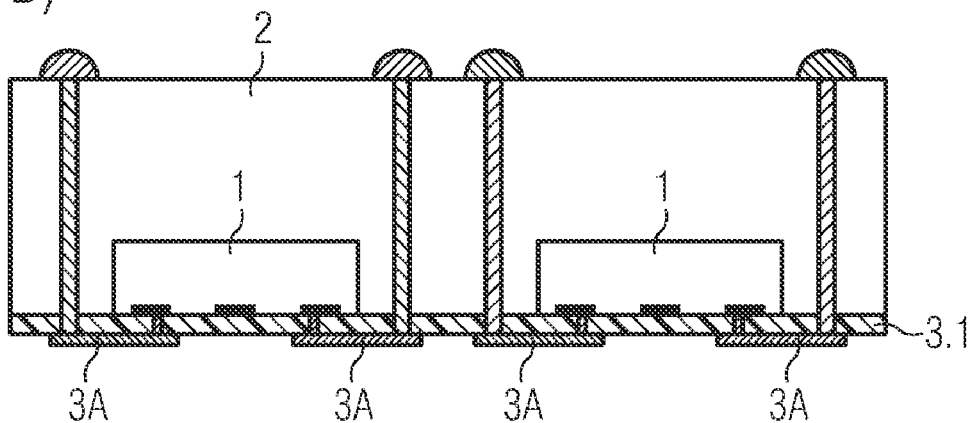
E)
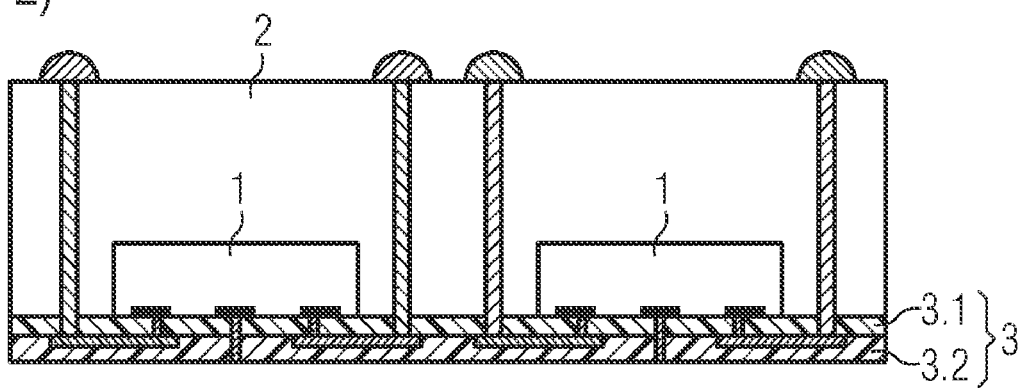
F)
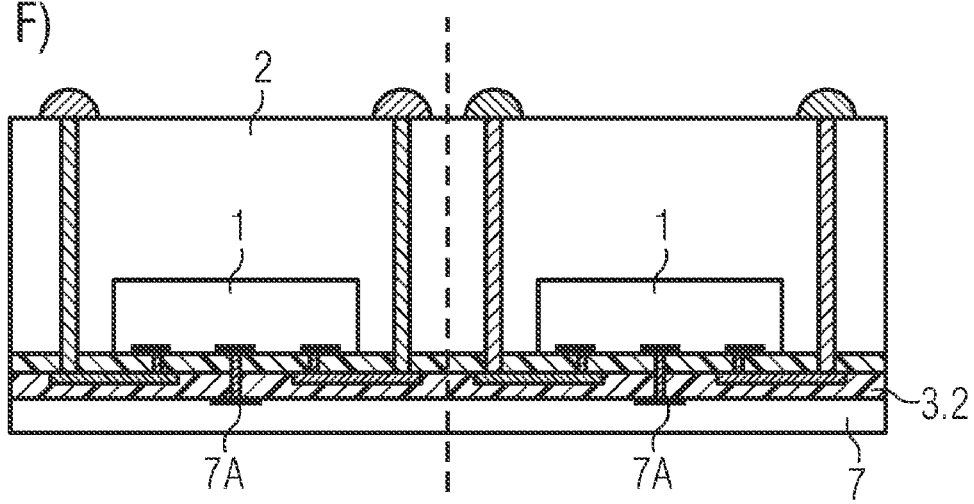

SEMICONDUCTOR DEVICE

BACKGROUND OF THE INVENTION

The present invention relates to a semiconductor device and a method of manufacturing a semiconductor device.

Semiconductor chips comprise contact pads or contact elements. In a semiconductor chip package the semiconductor chip is embedded or housed within the chip package and the contact pads of the semiconductor chip are connected to external contact elements of the chip package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not to scale or not necessarily to scale relative to each other. Like reference numerals designate corresponding similar parts.

Aspects of the invention are made more evident in the following detailed description of embodiments when read in conjunction with the attached drawing figures, wherein:

FIG. 4 shows a schematic cross-section representation of an embodiment of a semiconductor device comprising a color sensitive layer;

FIG. 5 shows a schematic cross-section representation of an embodiment of a semiconductor device comprising a polymer layer;

FIG. 6 shows a schematic cross-section representation an embodiment of a semiconductor device comprising a pressure-sensitive polymer layer;

FIG. 7 shows a schematic cross-section representation of an embodiment of semiconductor device comprising a sensor with a deformable layer;

FIG. 8A shows a schematic cross-section representation of an embodiment of a semiconductor device comprising a sensor with a deformable layer;

FIG. 8B shows a schematic representation of a top view of a complete device structure containing embodiments of FIG. 8A.

FIG. 9A shows a schematic cross-section representation of an embodiment of a semiconductor device comprising a surface acoustic wave filter;

FIG. 9B shows a schematic representation of a perspective view of the filter layer used in the embodiment of FIG. 9A.

FIGS. 12A-F show schematic cross-section representations of products for illustrating an embodiment of the method of fabricating a semiconductor device.

DETAILED DESCRIPTION OF THE INVENTION

Figure 1:
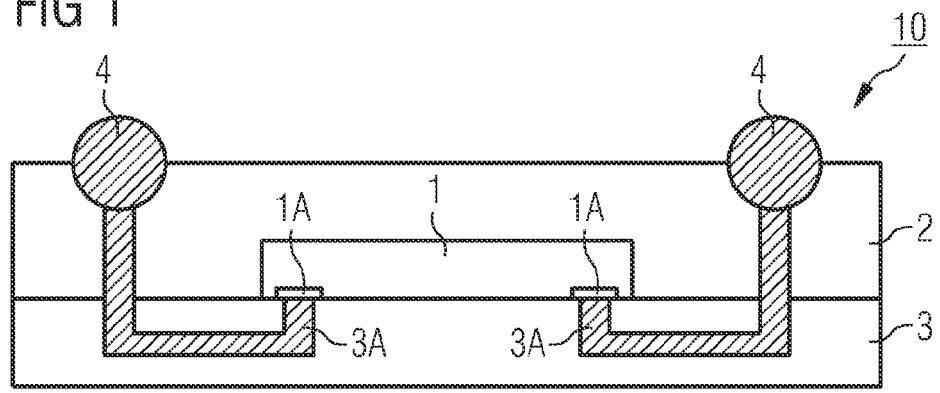
FIG. 1 shows a schematic cross-section representation of a semiconductor device according to an embodiment.

In the following detailed description, reference is made to the accompanying drawings, which form a part hereof, and in which is shown by way of illustration specific embodiments. In this regard, directional terminology, such as "top", "bottom", "front", "back", "leading", "trailing", etc., is used with reference to the orientation of the figure(s) being described. Because components of embodiments can be positioned in a number of different orientations, the directional terminology is used for purposes of illustration and is in no way limiting. It is to be understood that structural changes may be made within the specific embodiment.

The aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a semiconductor chip package and a method of fabricating a semiconductor chip package each comprise at least one semiconductor chip. The semiconductor chips described herein may be of different types, may be manufactured by different technologies and may include for example integrated electrical, electro-optical or electro-mechanical circuits and/or passives. The semiconductor chips may, for example, be configured as MOSFETs (Metal Oxide Semiconductor Field Effect Transistors), IGBTs (Insulated Gate Bipolar Transistors), JFETs (Junction Gate Field Effect Transistors), bipolar transistors or diodes. Furthermore, the semiconductor wafers and chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its front side and backside. By way of example, the source electrode and gate electrode of a power MOSFET may be situated on one main surface, while the drain electrode of the power MOSFET may be arranged on the other main surface. Furthermore, the devices described below may include integrated circuits to control the integrated circuits of other semiconductor chips, for example the integrated circuits of power semiconductor chips. The semiconductor chips described herein may be manufactured from any specific semiconductor material, for example Si, SiC, SiGe, GaAs, etc., and, furthermore, may contain inorganic and/or organic materials that are not semiconductors, such as for example insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layer onto each other. In particular, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the so-called redistribution layer (RDL). The redistribution layer can be in the form of a multi-layer, in particular a multi-layer comprising a repeating layer sequence. The redistribution layer can also be in the form of a metallization layer comprising one or more planes in which metallic or electrically conductive contact areas are provided.

Furthermore, the semiconductor chips described below may comprise contact elements or contact pads on one or more of their outer surfaces wherein the contact elements serve for electrically contacting the semiconductor chips. The contact elements may have the form of lands, i.e. flat contact layers on an outer surface of the semiconductor chip. The metal layer(s) of which the contact elements are made may be manufactured with any desired material composition. Any desired metal or metal alloy, for example aluminum, titanium, gold, silver, copper, palladium, platinum, nickel, chromium or nickel vanadium, may be used as a layer material. The metal layer(s) need not be homogenous or manufactured from just one material, that is to say various compositions and concentrations of the materials contained in the metal layer(s) are possible. The contact elements may be situated on the active main surfaces of the semiconductor chips or on other surfaces of the semiconductor chips.

The semiconductor chips may become covered with an encapsulating material. The encapsulating material can be any electrically insulating material like, for example, any kind of molding material, any kind of epoxy material, or any kind of resin material. In the process of covering the semiconductor chips or dies with the encapsulating material, fan-out embedded dies can be fabricated. The fan-out embedded dies can be arranged in an array having the form e.g. of a wafer and will thus be called a "re-configured wafer" further below. However, it should be appreciated that the fan-out embedded die array is not limited to the form and shape of a wafer but can have any size and shape and any suitable array of semiconductor chips embedded therein.

In the claims and in the following description different embodiments of a method of fabricating a semi-conductor chip package are described as a particular sequence of processes or measures, in particular in the flow diagrams. It is to be noted that the embodiments should not be limited to the particular sequence described. Particular ones or all of the processes or measures can also be conducted simultaneously or in any other useful and appropriate sequence.

Referring to FIG. 1, there is shown a cross-sectional representation of a semiconductor device according to an embodiment. The semiconductor device 10 comprises a semi-conductor chip 1 defining a first face and a second face opposite to the first face, the semiconductor chip 1 comprising contact elements 1A located on the first face of the chip 1. The semiconductor device 10 further comprises an encapsulating body 2 encapsulating the chip 1, the encapsulating body 2 having a first face and a second face opposite to the first face. The semiconductor device 10 further comprises a redistribution layer 3 extending over the semiconductor chip 1 and the first face of the encapsulating body 2, the redistribution layer 3 containing a metallization layer comprising contact areas 3A connected with the contact elements 1A of the semiconductor chip 1. The semiconductor device 10 further comprises an array of external contact elements 4 located on the second face of the encapsulating body 2.

One of the advantages of the semiconductor device according to FIG. 1 is the fact that the external contact elements 4 on the second face of the encapsulating body 2 may reduce the mechanical stress exposed on the external contact elements 4, when the semiconductor device is soldered to a printed circuit board (PCB) as the coefficient of thermal extension (CTE) of encapsulation material is usually in the same range as the CTE of the PCB. Moreover, with the external contact elements 4 on the second face of the encapsulating body 2, the redistribution layer 3 on the other side of the semiconductor device 10 may be used to connect different types of functional layers like sensors, polymer electronics, as will be explained and outlined along with further embodiments further below.

The semiconductor device can be fabricated by the extended wafer level package technology as will be explained in detail further below. As already indicated above, this process technology includes producing a re-configured wafer in which a plurality of semiconductor chips is embedded, the semiconductor chips having sufficient distance from each other so that a fan-out of the electrical contacts of the semiconductor chips becomes possible. The extended wafer level package process also includes the fabrication of the redistribution layer for spatially redistributing electrical contacts of the chip. Also enclosed within the extended wafer level package process can be the fabrication of a functional layer over the redistribution layer which will also be described in further detail below.

According to an embodiment of the semiconductor device as shown in FIG. 1, the one or more contact elements 1A of the semiconductor chip 1 are located only on the first face of the chips. According to this embodiment there are no contact elements located on the second face of the semiconductor chip.

According to an embodiment of the semiconductor device as shown in FIG. 1, there can at least one further contact element be located on the first face of the semiconductor chips, the further contact element or elements not being connected with the contact areas 3A of the metallization layer and also not connected with the external contact elements 4. Instead the further contact element can, for example, be connected with any sort of functional layer applied over the metallization layer.

According to an embodiment of the semiconductor device of FIG. 1, the semiconductor chip 1 further comprises at least one of an integrated circuit, a sensor, a transistor, a diode, and a passive electric component.

According to an embodiment of the semiconductor device of FIG. 1, the external contact elements 4 are electrically coupled with the contact areas 3A of the metallization layer.

According to an embodiment of the semiconductor device of FIG. 1, the external contact elements 4 are electrically coupled with the at least one contact element 3A of the semiconductor chip 1.

According to an embodiment of the semiconductor device of FIG. 1, the external contact elements 4 are comprised of solder elements like, for example, solder balls or solder bumps.

According to an embodiment of the semiconductor device of FIG. 1, the semiconductor device further comprises at least one through-connect extending through the encapsulating body 2, the through-connect coupling the redistribution layer with one of the external contact elements 4.

According to an embodiment of the semiconductor device of FIG. 1, the semiconductor device further comprises a sensor applied over the redistribution layer. According to a further embodiment thereof, the sensor can comprise one or more of a pressure sensor, a chemical sensor, a biological sensor, a gas sensor, and an acceleration sensor.

According to an embodiment of the semiconductor device of FIG. 1, the semiconductor device further comprises a polymer layer applied over the redistribution layer, wherein the polymer layer may comprise at least one active electronic device.

According to an embodiment of the semiconductor device of FIG. 1, the semiconductor device further comprises a filter element applied to the redistribution layer 3. According to a further embodiment thereof, the filter element comprises one or more of an optical filter, an acoustic wave filter, an interference filter, and a Fabry-Perot filter.

According to an embodiment of the semiconductor device of FIG. 1, the semiconductor device further comprises a mechanically deformable layer applied over the redistribution layer 3. According to a further embodiment thereof, the mechanically deformable layer can be part of or be integrated together with a sensor element applied over the redistribution layer 3.

According to the embodiment as depicted in FIG. 1, the semiconductor chip 1 is arranged horizontally within the semiconductor device 10 which means that the first and second faces of the semiconductor chip 1 are arranged parallel to the main faces of the encapsulation layer 2 and the redistribution layer 3. However, it is also possible according to an alternative embodiment that the semiconductor chip 1 is arranged vertically within the semiconductor device 10 as will be shown further below in greater detail.

According to an embodiment of the semiconductor device of FIG. 1, the geometrical dimensions of the layers can be within the following ranges. The semiconductor chip 1 can have a thickness in a range of 50 μm to 10 mm, a width of 50 μm to 2 cm, and a length of 50 μm to 2 cm, and the redistribution layer 3 can have a thickness of 100 nm to 2 cm, and the functional layer can have a thickness of 10 nm to 2 cm.

Figure 2:
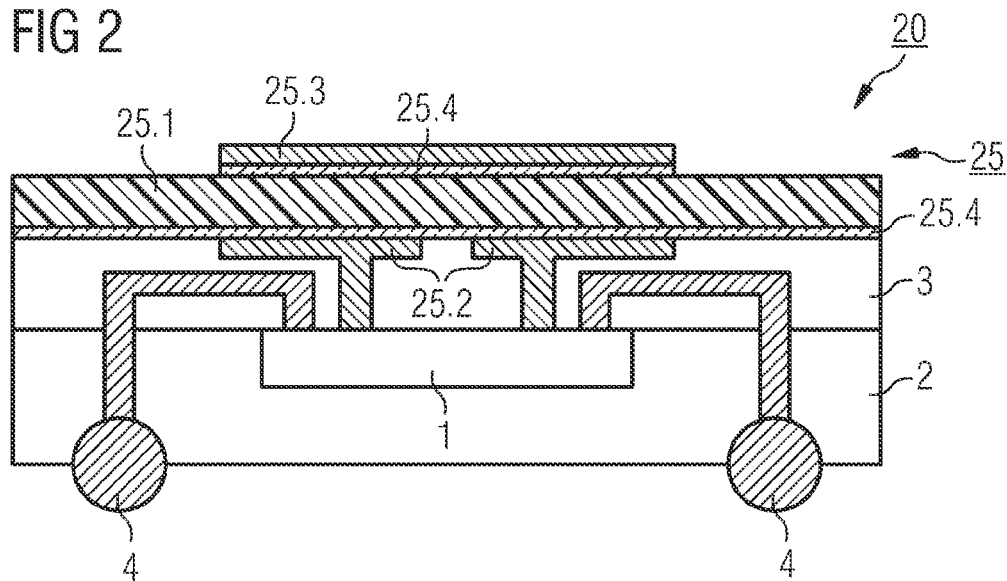
FIG. 2 shows a schematic cross-section representation of an embodiment of a semiconductor device comprising a swellable sensor layer.

Referring to FIG. 2, there is shown a cross-sectional representation of a semiconductor device according to an embodiment. The semiconductor device 20 comprises a semi-conductor chip 1, an encapsulating body 2, a redistribution layer 3, and external contact elements 4 such as those described in connection with the embodiment of FIG. 1. The semiconductor device 20 further comprises a sensor element 25 applied over the redistribution layer 3. The sensor element 25 comprises a layer 25.1 made of any sort of swellable material. The layer 25.1 is intended to change its thickness when it gets in contact with any liquid or gaseous material which is known to be absorbed by the material of layer 25.1. The layer 25.1 can, for example, comprise or consist of polyethylen. Such material is known to swell up under the influence of or the exposure to oil. Other materials for the layer 25.1 are also possible, in particular layers which are known to swell up under the exposure of water, alcohol, or gasses or liquids containing specifications. The sensor 25 further comprises first capacitor electrodes 25.2 and a second capacitor electrode 25.3 and insulation layers 25.4 electrically insulating the capacitor electrodes 25.2 and 25.3 from the layer 25.1. The first capacitor electrodes 25.2 are electrically connected with contact pads on the first face of the semiconductor chip 1. The capacitor electrodes 25.2 and 25.3 and the layer 25.1 in-between the capacitor electrodes form a capacitor, the capacity of which is determined i.e. by the material and the thickness of the layer 25.1. A change of one or more of the thickness and consistency of the layer 25.1 due to the swelling or absorbing of any environmental liquid or gaseous material will thus result in a change of the capacitance value of the capacitor which can be sensed and, if appropriate, even evaluated by the semiconductor chip 1.

Figure 3:
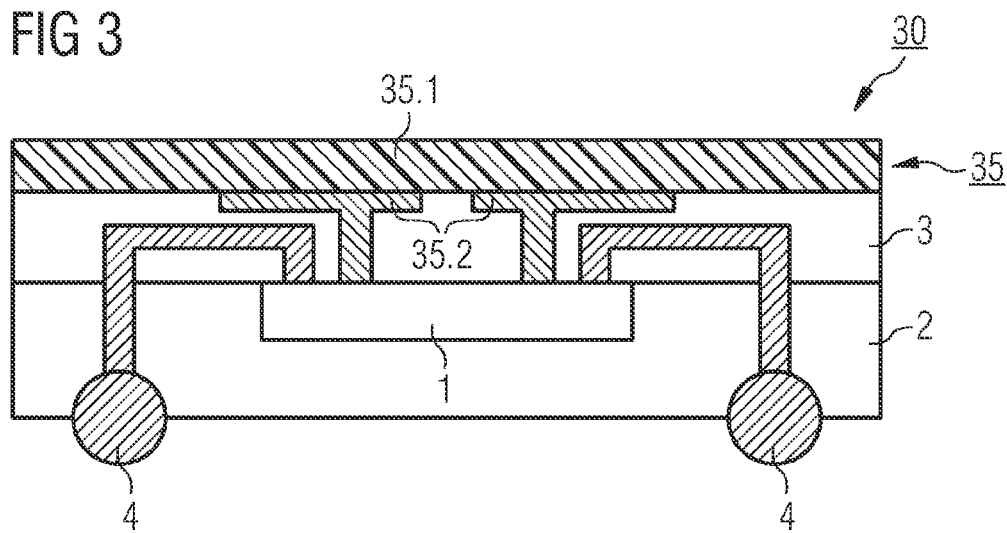
FIG. 3 shows a schematic cross-section representation of an embodiment of a semiconductor device comprising an absorbing sensor layer.

Referring to FIG. 3, there is shown a cross-sectional representation of a semiconductor device according to an embodiment. The semiconductor device 30 comprises a semi-conductor chip 1, an encapsulating body 2, a redistribution layer 3, and external contact elements 4 such as those described in connection with the embodiment of FIG. 1. The semiconductor device 30 further comprises a sensor 35, applied over the redistribution layer 3. The sensor 35 comprises a layer 35.1 and electrodes 35.2. The layer 35.1 is comprised of a material which is known for changing its electrical conductivity upon absorbing specified liquid or gaseous materials. The two electrode layers 35.2 are formed at an interface between the redistribution layer 3 and the sensor layer 35.1. The electrode layers 35.2 are electrically connected with contact pads on the first face of the semiconductor chip 1. A change in the electrical conductivity of the layer 35.1 can, for example, be detected by applying a voltage between the two electrode layer 35.2 and measuring the current flowing from one electrode layer 35.2 to the other through the material of the layer 35.1 in the semiconductor chip 1. The material of the layer 35.1, for example, can be comprised of chelat complexes.

Referring to FIG. 4, there is shown a cross-sectional representation of a semiconductor device according to an embodiment. The semiconductor device 40 comprises a semi-conductor chip 1, an encapsulating body 2, a redistribution layer 3, and external contact elements 4 such as those described in connection with the embodiment of FIG. 1. The semiconductor device 40 further comprises a sensor 45 for sensing liquid or gaseous media. The sensor 45 comprises a first optical filter layer 45.1 and a second optical filter layer 45.2, both optical filter layers being applied on the redistribution layer 3. The first optical filter layer 45.1 serves as a reference and comprises a material, the optical properties of which do not change in dependence on environmental conditions. On the other hand the second optical filter 45.2 comprises a material which is known to change its optical properties, in particular its optical absorption at particular wavelengths due to the influence of specific gaseous or liquids to be detected. The first optical filter layer 45.1 is connected with a first through-hole 45.3 which extends from the first optical filter layer 45.1 through the redistribution layer 3 to the first face of the semiconductor chip 1. A first photodiode 45.4 is located on the first face of the semiconductor chip 1 aligned with the first through-hole 45.3. The second optical filter layer 45.2 is connected with a second through-hole 45.5 which extends from the second optical filter 45.2 through the redistribution layer 3 to the first face of the semiconductor chip 1. A second photodiode 45.6 is located on the first face of the semiconductor chip 1 aligned with the second through-hole 45.5. The through-holes 45.3 and 45.5 are either empty or filled with an optically transparent material. The light which is transmitted through optical filter layers 45.1 and 45.2 will be detected by the photodiodes 45.4 and 45.6 and the signal outputs of the photodiodes 45.4 and 45.6 can be used to derive therefrom a quantity which is a measure of the change of the optical properties of the second optical filter layer 45.2 and thus for the amount or strength of the gas or liquid to be detected therewith. As an alternative to the embodiment as shown in FIG. 4, it is also possible to use a single optical filter layer and to measure only the change of optical properties of the single optical filter layer with a single photodiode on the semiconductor chip. As a further embodiment, the one or two optical filter layers applied on the redistribution layer 3 can also be comprised of an interference filter or of a micro-mechanical tunable Fabry-Perot filter.

Referring to FIG. 5, there is shown a cross-sectional representation of a semiconductor device according to an embodiment. The semiconductor device 50 comprises a semi-conductor chip 1, an encapsulating body 2, a redistribution layer 3, and external contact elements 4 such as those described in connection with the embodiment of FIG. 1. The semiconductor device 50 further comprises a polymer layer 51 applied onto the redistribution layer 3. The polymer layer 51 can comprise any type of electronic or opto-electronic components to fulfill different functions. The polymer layer 51, for example, can comprise OLED (Organic Light Emitting Diodes) devices or it can also comprise electronic components like, for example, transistors or diodes. It is also shown that the polymer layer 51 is connected with the semiconductor chip 1 by two through-connects extending through the redistribution layer 3.

Referring to FIG. 6, there is shown a cross-sectional representation of a semiconductor device according to an embodiment. The semiconductor device 60 comprises a semi-conductor chip 1, an encapsulating body 2, a redistribution layer 3, and external contact elements 4 such as those described in connection with the embodiment of FIG. 1. The semiconductor device 60 further comprises a polymer layer 61 which in this case serves the purpose of a pressure sensor. Polymer materials are known to change their electrical conductivity upon exertion of pressure upon a surface thereof. The polymer layer 61 can therefore simply be connected by through-connects extending through the redistribution layer 3 with contact pads on the first face of the semiconductor chip 1. A voltage can be applied by the semiconductor chip 1 between the two contact points of the through-connects with the polymer layer 1 and the current flowing between the two contact points can be measured in dependence on the pressure exerted onto the upper surface of the polymer layer 61.

Referring to FIG. 7, there is shown a cross-sectional representation of a semiconductor device according to an embodiment. The semiconductor device 70 comprises a semi-conductor chip 1, an encapsulating body 2, a redistribution layer 3, and external contact elements 4 such as those described in connection with the embodiment of FIG. 1. The semiconductor device 70 further comprises a sensor 75 applied onto the redistribution layer 3. The sensor 75 comprises a deformable layer 75.1 which, for example, can be fabricated of silicone. The sensor 75 further comprises first electrodes 75.2 and a second electrode 75.3. The first electrodes 75.2 and the second electrode 75.3 form a capacitor, the capacitance value of which is determined i.e. by the thickness and the material of the deformable layer 75.1. The first electrodes 75.2 are connected with contact pads of the semiconductor chip 1 by through-connects extending through the redistribution layer 3. The change of the capacitance value of the capacitor can be measured similar to the embodiment of FIG. 2, and the measured capacitance changes can be taken as a measure of the external force or pressure exerted on the deformable layer 75.1.

Referring to FIGS. 8A,B, there is shown a cross-sectional representation of a semiconductor device according to an embodiment (A). The semiconductor device 80 comprises a semiconductor chip 1, an encapsulating body 2, a redistribution layer 3, and external contact elements 4 such as those described in connection with the embodiment of FIG. 1. The semiconductor device 80 further comprises a sensor 85 which is a mechanical sensor intended to sense acceleration and vibration movements. The sensor 85 is similar to the sensor 75 of FIG. 7 and also comprises a deformable layer 85.1 and first and second electrodes on lower and upper surfaces of the deformable layer 85.1. In addition a mass 85.4 is applied onto the upper electrode 85.3. Upon acceleration or vibration of an object like a vehicle, the mass 85.4 will be moved due to its inert mass. The resultant deformation of the deformable layer 85.1 can then be detected by the change of the capacitance value of the capacitor. FIG. 8B shows a top view of a complete device structure which shows that on a rectangular shaped deformable layer 85.1 four mass bodies 85.4 may be attached near the four corners of the rectangular shaped deformable layer 85.1.

Referring to FIGS. 9A,B, there is shown a cross-sectional representation of a semiconductor device according to an embodiment (A). The semiconductor device 90 comprises a semiconductor chip 1, an encapsulating body 2, a redistribution layer 3, and external contact elements 4 such as those described in connection with the embodiment of FIG. 1. The semiconductor device 90 further comprises a surface acoustic wave (SAW) filter 95. The SAW filter 95 comprises a layer 95.1 which can be made from materials like ZnO or AlN or any other piezo-electrical material. The SAW filter 95 further comprises an electrode structure such as that shown in FIG. 9B. The electrode structure shown in FIG. 9B is in principle known from SAW filters and will not be described in detail here. The electrodes applied onto the upper surface of the filter layer 95.1 are electrically connected with contact pads on the first face of the semiconductor chip 1 by respective through-connects through the redistribution layer 3 and the filter 95.1.

Figure 10:
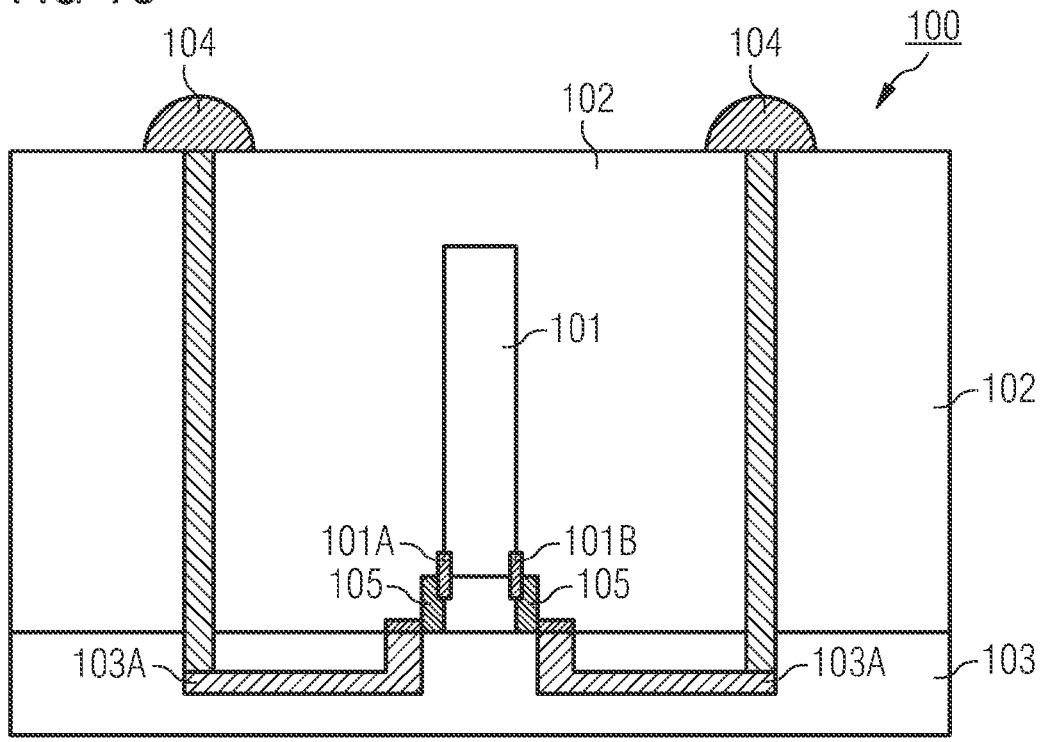
FIG. 10 shows a schematic cross-section representation of a semiconductor device according to an embodiment.

Referring to FIG. 10, there is shown there is shown a cross-sectional representation of a semiconductor device according to an embodiment. The semiconductor device 100 comprises a semiconductor chip 101 defining a first face and a second face opposite to the first face, the semiconductor chip 101 comprising contact elements 101A located on the first face of the chip 101 and contact elements 101B located on the second face of the chip 101. The semiconductor device 100 further comprises an encapsulating body 102 encapsulating the chip 101, the encapsulating body 102 having a first face and a second face opposite to the first face. The semiconductor device 100 further comprises a redistribution layer 103 extending over the semiconductor chip 101 and the first face of the encapsulating body 102, the redistribution layer 103 containing a metallization layer comprising contact areas 103A connected with the contact elements 101A and 101B of the semiconductor chip 101. The semiconductor device 100 further comprises an array of external contact elements 104 located on the second face of the encapsulating body 102. An essential feature of the semiconductor device 100 of FIG. 10 is that the semiconductor chip 101 is oriented vertically within the semiconductor device 100, that means the first and second faces of the semiconductor chip 101 are oriented perpendicular to the main faces of the encapsulating layer 102 and the redistribution layer 103 and side faces of the semiconductor chip 101 are oriented parallel to the main faces of the encapsulating layer 102 and the redistribution layer 103. In fact in the embodiment as depicted in FIG. 10 the semiconductor chip 101 rests with one of its side faces on an upper surface of the redistribution layer 103. The contact elements 101A and 101B of the semiconductor chip 101 are electrically connected to the contact areas 103A by means of electrically conducting elements 105 attached to the contact elements 101A and 102A on the first and second faces of the semiconductor chip 101. The electrically conducting elements 105 can be formed and arranged such that they also function as support structures for the semiconductor chip 101 as the semiconductor chip 101 can be as thin as 50 µm so that the side face will have a width of 50 µm accordingly and the support structures will help to enlarge the area of the side face resting on the redistribution layer 103. According to another embodiment the contact elements 101A, 101B can also be arranged on only one of the first and second surfaces of the semiconductor chip 101 in which case the above mentioned support structures can still be arranged on both surfaces only one of which will be needed then for electrically contacting the contact elements to the contact areas of the redistribution layer.

Figure 11:
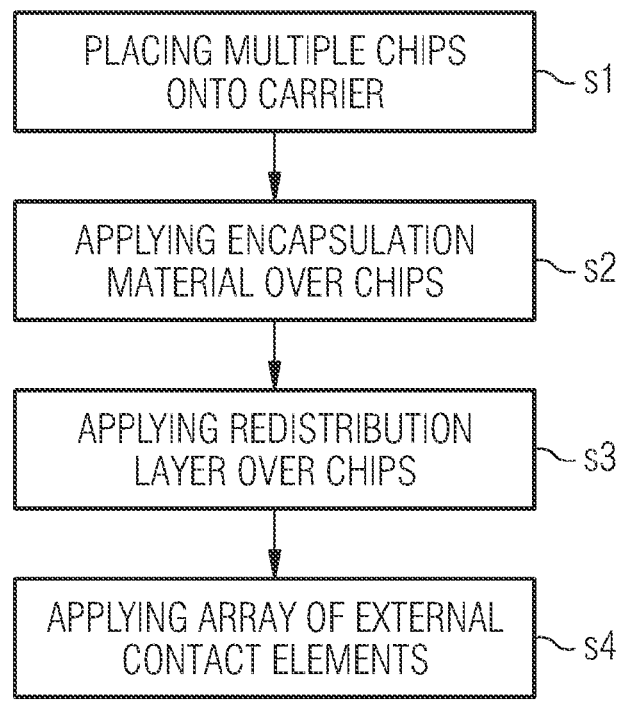
FIG. 11 shows a flow diagram of a method of manufacturing a semiconductor device according to an embodiment.

Referring to FIG. 11, there is shown a flow diagram of a method of manufacturing a semiconductor device according to an embodiment. The method comprises placing multiple semi-conductor chips onto a carrier each of the semiconductor chips having a first face facing the carrier and a second face opposite to the first face (s1), applying an encapsulation material over the multiple semiconductor chips and the carrier to form an encapsulating body having a first face facing the carrier and a second face opposite to the first face (s2), applying a redistribution layer over the first faces of the multiple semiconductor chips and the first face of the encapsulating body (s3), and applying an array of external contact elements to the second face of the encapsulating body (s4).

According to an embodiment of the method of FIG. 11, the method further comprises removing the encapsulating body from the carrier.

According to an embodiment of the method of FIG. 11, the method further comprises generating at least one through-connect extending through the encapsulating body. According to a further embodiment thereof, generating the at least one through-connect comprises generating at least one through-hole through the encapsulating body and filling the through-hole with an electrically conducting material. According to a further embodiment thereof, generating at least one through-hole comprises at least one of etching the at least one through-hole, drilling the at least one through hole, and laser etching the at least one through-hole. According to a further embodiment, generating the at least one through-connect comprises attaching metal bars to the carrier and afterwards applying the encapsulating material, so that the metal bars are embedded within the encapsulating layer, the metal bars having a length so that they exceed through the encapsulating layer (ViaBars). The metal bars can be attached to the carrier in a pick-and-place process, wherein essentially the same pick-and-place-equipment can be used as that used for placing the semiconductor chips and the placing of the metal bars can be done immediately before or after the placing of the semiconductor chips.

According to an embodiment of the method of FIG. 11, the method further comprises electrically coupling the redistribution layer with the at least one contact element.

According to an embodiment of the method of FIG. 11, the method further comprises electrically coupling the external contact elements with the contact areas of the metallization layer.

According to an embodiment of the method of FIG. 11, the method further comprises electrically coupling the external contact elements with the at least one contact element of the chip.

According to an embodiment of the method of FIG. 11, the method further comprises applying a sensor, in particular one or more of a pressure sensor, a chemical sensor, a biological sensor, a gas sensor, and an acceleration sensor, over the redistribution layer.

According to an embodiment of the method of FIG. 11, the method further comprises applying a polymer layer over the electrically conductive layer, the polymer layer comprising at least one active electronic device.

According to an embodiment of the method of FIG. 11, the method further comprises applying a filter element, in particular one or more of an optical filter, an acoustic wave filter, an interference filter and a Fabry-Perot filter, to the redistribution layer.

According to an embodiment of the method of FIG. 11, the method further comprises applying a mechanically deformable layer to the redistribution layer.

According to an embodiment of the method of FIG. 11, the method further comprises singulating the obtained structure into a plurality of semiconductor devices.

Referring to FIGS. 12A-F, there are shown cross-sectional representations of intermediate products for illustrating a method for fabricating a semiconductor device according to an embodiment.

As shown in FIG. 12A, semiconductor chips 1 are placed onto a carrier 5 with a sufficient spacing from each other in order to allow fan-out of the electrical contact as will be seen later. A pick-and-place machine can be used for placing the semiconductor chips 1 onto the carrier 5. The semiconductor chips 1 each comprise a plurality of electrical contact elements 1A on a first main face. The carrier 5 can in principle be made of any material and in most cases the carrier will be completely removed after applying of the encapsulating material and to apply a redistribution layer instead. However, it is also possible not to remove the carrier or to remove only a part of the carrier and to utilize the remaining portion of the carrier as part of the redistribution layer to be fabricated. In this case the carrier itself or the part of the carrier, which is intended to be left back, may be a dielectric or electrically insulating layer.

In the following, a re-configured wafer is produced during applying of an encapsulation layer 2 as shown in FIG. 12B. For example, a mold form can be used which has the form of a wafer so that by this kind of wafer molding, for example, a 200 mm or 300 mm re-configured wafer is produced.

Referring to FIG. 12C, in a first step of fabricating a redistribution layer (RDL) the carrier 5 can be removed and a first insulating layer 3.1 be applied instead. As was outlined above, the first insulating layer 3.1 can be part of the carrier 5 so that only the other part of the carrier 5 is removed or the first insulating layer 3.1 is identical with the carrier 5 so that the carrier 5 is in fact not removed but utilized to become part of the redistribution layer to be fabricated. It is also possible that the carrier 5 is removed and no layer is actively applied to replace the carrier 5 wherein instead the last layer on the surface of the semiconductor chip 1 and the contact elements 1A serves as the first insulating layer 3.1.

Afterwards electrical through-connects are formed into the first insulating layer 3.1, the through-connects being aligned with particular ones of the electrical contact elements 1A. Afterwards electrical contact areas 3A are formed on the surface of the first insulating layer 3.1, the electrical contact areas 3A being connected with the through connects.

Referring to FIG. 12D, through-connects are formed into the encapsulating layer and the first insulation layer 3.1, the through-connects being aligned with the electrical contact areas 3A. As was outlined above, the through-connects through the encapsulating layer 2 can also be fabricated in an earlier step by pick-and-place metal bars onto the carrier 5 and embedding them in the encapsulating material so that later on only through-connects will have to be formed through the first insulation layer 3.1. Afterwards solder bumps are formed on the surface of the encapsulating layer 2, the solder bumps being electrically connected to the through connects. For this purpose, it is also possible to form a solder resist layer (not shown) onto the surface of the encapsulating layer 2, the solder resist layer having openings aligned with the through-connects through the encapsulating layer 2. After applying the solder resist layer, the solder bumps can be formed into the openings of the solder resist layer.

Referring to FIG. 12E, on the other side of the structure a second insulation layer 3.2 is formed onto the contact areas 3A and the first insulation layer 3.1 so that as a result the redistribution layer 3 is formed by the first insulation layer 3.1, the second insulation layer 3.2 and the contact areas 3A embedded in between the first and second insulation layers 3.1 and 3.2. Afterwards through-connects are formed through the second insulation layer 3.2 and the first insulation layer 3.1, the through-connects being aligned with remaining contact elements 1A of the semiconductor chips 1.

Referring to FIG. 12F, a functional layer 7 is applied onto the redistribution layer 3, wherein the functional layer 7 can fulfill any function which was described above in connection with the embodiments of FIGS. 2 to 10, in particular anyone of the sensor or filter functions as described therein. The function layer 7 comprises at least one contact element 7A which is aligned with the through-connect formed into the first and second insulation layers 3.1 and 3.2 so that the functional layer 7 can be electrically connected to the semiconductor chip 1. At the end, the obtained structure will be singulated into a plurality of semiconductor devices as indicated by the dashed line.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a single semiconductor chip defining a first face and a second face opposite to the first face, the semiconductor chip comprising at least one contact element on the first face of the semiconductor chip;
an encapsulating body encapsulating the semiconductor chip, the encapsulating body having a first face and a second face opposite to the first face, the first face of the encapsulating body coplanar with the first face of the semiconductor chip, the second face of the encapsulating body spaced apart from the second face of the semiconductor chip such that the second face of the semiconductor chip contacts the encapsulating body;
a redistribution layer extending over the semiconductor chip and the first face of the encapsulating body, and containing a metallization layer comprising contact areas, wherein at least one contact area is connected with at least one contact element of the semiconductor chip;
a functional layer disposed on the redistribution layer, where at least one contact element of the semiconductor chip is connected with the functional layer; and
an array of external contact elements located on the second face of the encapsulation body.

2. The semiconductor device according to claim 1, wherein the contact elements of the semiconductor chip are located only on the first face of semiconductor chip.

3. The semiconductor device according to claim 1, wherein the semiconductor chip further comprises at least one of an integrated circuit, a sensor, a transistor, a diode, and a passive electrical component, electrically coupled with the at least one contact element.

4. The semiconductor device according to claim 1, wherein the external contact elements are electrically coupled with the contact areas of the metallization layer.

5. The semiconductor device according to claim 1, wherein the external contact elements are electrically coupled with the at least one contact element of the semiconductor chip.

6. The semiconductor device according to claim 1, wherein the external contact elements comprise solder elements, in particular solder balls or solder bumps.

7. The semiconductor device according to claim 1, further comprising:
at least one through-connect extending through the encapsulating body, the through-connect coupling the metallization layer with one of the external contact elements.

8. The semiconductor device according to claim 1, further comprising:
a sensor applied over the metallization layer.

9. The semiconductor device according to claim 8, wherein the sensor is one or more of a pressure sensor, a chemical sensor, a biological sensor, a gas sensor, and an acceleration sensor.

10. The semiconductor device according to claim 1, further comprising:
a polymer layer applied over the metallization layer, the polymer layer comprising at least one active electronic device.

11. The semiconductor device according to claim 1, further comprising:
a filter element applied to the metallization layer.

12. The semiconductor device according to claim 11, wherein
the filter element comprises one or more of an optical filter, an acoustic wave filter, an interference filter, a Fabry-Perot filter.

13. The semiconductor device according to claim 1, further comprising:
a mechanically deformable layer applied over the metallization layer.

14. The semiconductor device according to claim 1, wherein:
the semiconductor chip is oriented horizontally within the semiconductor device.

15. The semiconductor device according to claim 1, wherein
the semiconductor chip is oriented vertically within the semiconductor device.

16. A semiconductor device, comprising:
a single semiconductor chip comprising at least one contact element on a main face thereof;
an encapsulating layer encapsulating the semiconductor chip, the encapsulating layer having a first face and a second face opposite to the first face, the first face of the encapsulating layer coplanar with the main face of the semiconductor chip, the second face of the encapsulating layer spaced apart from a face of the semiconductor chip opposite the main face such that the face of the semiconductor chip opposite the main face contacts the encapsulating layer;
a redistribution layer extending over the semiconductor chip and the first face of the encapsulating layer, and containing a metallization layer comprising contact areas, wherein at least one contact area is connected with at least one contact element of the semiconductor chip;
a functional layer disposed on the redistribution layer, where at least one contact element of the semiconductor chip is connected with the functional layer; and
an array of external contact elements located on the second face of the encapsulation layer.

17. A semiconductor device, comprising:
a semiconductor chip defining a first face and a second face opposite to the first face, the semiconductor chip comprising at least one contact element on the first face of the semiconductor chip;
an encapsulating body encapsulating the semiconductor chip, the encapsulating body having a first face coplanar with the first face of the semiconductor chip and a second face opposite to the first face, the encapsulating body in direct contact with and covering the entire second face of the semiconductor chip;
a redistribution layer extending over the semiconductor chip and the first face of the encapsulating body, and containing a metallization layer comprising contact areas connected with the contact elements of the semiconductor chip;
a functional layer, other than a semiconductor chip, arranged above the redistribution layer, wherein the functional layer comprises one or more of a sensor, a filter, a polymer layer comprising at least one active electronic device, and an optical device; and
an array of external contact elements located on the second face of the encapsulation body.

18. A semiconductor device, comprising:
a semiconductor chip comprising at least one contact element on a main face thereof and having an opposing face;
an encapsulating layer encapsulating the semiconductor chip, the encapsulating layer having a first face coplanar with the main face of the semiconductor chip and a second face opposite to the first face, the encapsulating layer in direct contact with and covering the opposing face of the semiconductor chip;
a redistribution layer extending over the semiconductor chip and the first face of the encapsulating layer, and containing a metallization layer comprising contact areas connected with the contact elements of the semiconductor chip;
a functional layer, other than a semiconductor chip, disposed on the redistribution layer, wherein the functional layer comprises one or more of a sensor, a filter, a polymer layer comprising at least one active electronic device, and an optical device; and
an array of external contact elements located on the second face of the encapsulation layer.

* * * * *